United States Patent [19]
Van Cleemput et al.

[11] Patent Number: 5,872,058
[45] Date of Patent: Feb. 16, 1999

[54] HIGH ASPECT RATIO GAPFILL PROCESS BY USING HDP

[75] Inventors: Patrick A. Van Cleemput, Sunnyvale; Thomas W. Mountsier, San Jose, both of Calif.

[73] Assignee: Novellus Systems, Inc., San Jose, Calif.

[21] Appl. No.: 876,949

[22] Filed: Jun. 17, 1997

[51] Int. Cl.⁶ .................................................. H01C 71/302
[52] U.S. Cl. ............................................ 438/692; 438/732
[58] Field of Search ................................. 438/692, 732, 438/733, 787, 788

[56] References Cited

U.S. PATENT DOCUMENTS

| | | | |
|---|---|---|---|
| 5,162,261 | 11/1992 | Fuller et al. | 437/195 |
| 5,614,055 | 3/1997 | Fairbairn et al. | 156/345 |
| 5,670,421 | 9/1997 | Nishitani et al. | 437/192 |
| 5,691,573 | 11/1997 | Avanzino et al. | 257/758 |
| 5,776,834 | 7/1998 | Avanzino et al. | 438/692 |

*Primary Examiner*—John F. Niebling
*Assistant Examiner*—Michael S. Lebentritt
*Attorney, Agent, or Firm*—Skjerven, Morrill, MacPherson, Franklin & Friel LLP; David E. Steuber; Tom Chen

[57] ABSTRACT

A process for filling high aspect ratio gaps on substrates uses conventional high density plasma deposition processes while reducing the concentration of the inert gas, such as Ar, to 0–13% of the total process gas flow. By reducing the inert gas concentration, sputtering or etching is reduced, resulting in reduced sidewall deposition from the sputtered material. Consequently, gaps with aspect ratios of 3.0:1 and higher can be filled without the formation of voids and without damaging circuit elements.

10 Claims, 5 Drawing Sheets

HIGH ASPECT RATIO GAPFILL PROCESS BY USING HDP

BACKGROUND

1. Field of the Invention

The present invention relates generally to methods of thin film deposition and specifically to a process of filling high aspect ratio gaps on substrates.

2. Description of Related Art

As semiconductor technology advances, circuit elements and interconnections on wafers or silicon substrates become increasingly more dense. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios, typically defined as the gap height divided by the gap width. As a result, filling these narrower gaps becomes more difficult, which can lead to unwanted voids and discontinuities in the insulating or gap-fill material.

Currently, high density plasma (HDP) oxide deposition is used to fill high aspect ratio gaps. Typical HDP deposition processes employ chemical vapor deposition (CVD) with a gas mixture containing oxygen, silane, and inert gases, such as argon, to achieve simultaneous dielectric etching and deposition. In an HDP process, an RF bias is applied to a wafer substrate in a reaction chamber. Some of these gas molecules (particularly argon) are ionized in the plasma and accelerate toward the wafer surface when the RF bias is applied to the substrate. Material is thereby sputtered when the ions strike the surface. As a result, dielectric material deposited on the wafer surface is simultaneously sputter etched to help keep gaps open during the deposition process, which allows higher aspect ratio gaps to be filled.

FIGS. 1A–1D illustrate, in more detail, the simultaneous etch and deposition (etch/dep) process described above. In FIG. 1A, $SiO_2$, formed from silane ($SiH_4$) and oxygen ($O_2$), begins depositing on the surface of a wafer 100 for filling a gap 110 between circuit elements 120. As the $SiO_2$ is being deposited, charged ions impinge on the $SiO_2$ or dielectric layer 125, thereby simultaneously etching the $SiO_2$ layer. However, because the etch rate at about 45° is approximately three to four times that on the horizontal surface, 45° facets 130 form at the corners of elements 120 during the deposition process, as shown in FIG. 1B. FIGS. 1C and 1D show the process continuing to fill gap 110 with simultaneous etching and deposition of $SiO_2$.

In FIGS. 1A–1D, the etch/dep ratio is optimized such that facets 130 remain at the corners of circuit elements 120 throughout the HDP deposition process. However, as shown in FIG. 2A, if the etch/dep ratio is decreased, facets 130 begin moving away from the corners of elements 120, and cusps 210 begin to form on sidewalls of gap 110. Cusp formation is due to some of the etched $SiO_2$ being redeposited on opposing surfaces through line-of-sight redeposition, even though most of the etched $SiO_2$ is emitted back into the plasma and pumped out of the reaction chamber. This redeposition increases as the distance between opposing surfaces decreases. Therefore, as facets 130 move away from the corners of elements 120, the line-of-sight paths are shortened, resulting in increased sidewall redeposition. At a certain point in the process, cusps 210 will meet and prevent further deposition below the cusps. When this occurs, a void 220 is created in dielectric layer 125, as shown in FIG. 2B. On the other hand, if the etch/dep ratio is increased, as shown in FIG. 3, the etching component can etch or "clip" material from the corners of elements 120, thereby damaging elements 120 and introducing etched contaminants 310 into dielectric layer 125.

The etch/dep ratio can be controlled by varying the flow rate of silane or other process gases, which affect the deposition rate, or by varying either the power supplied to the wafer for biasing or the flow rate of argon or other inert gases, which affect the sputter etch rate. Etch rates are typically increased by increasing the flow rate of the inert gas, which is used solely to promote sputtering, rather than increasing power and expending large amounts of energy. Typical argon flow rates for HDP deposition range from 30%–60% or more of the total process gas flow rate. By optimizing the etch/dep ratio, gaps with aspect ratios of up to about 3.0:1 can be filled without voids. However, as shown in FIG. 4, filling higher aspect ratio gaps results in voids 410 due to cusps 420 prematurely closing the gaps even if the etch/dep ratio is optimized to 1 at the element corners. As discussed above, this is due mainly to the shortened line-of-sight path between opposing sidewalls. If the etch rate is increased to keep the gaps open longer, undesirable corner clipping can occur.

Therefore, with circuit densities increasing, higher aspect ratio gaps need to be filled without the problems discussed above with current HDP deposition processes.

SUMMARY

In accordance with the present invention, a high aspect ratio gap-fill process uses high density plasma (HDP) deposition processes with reduced inert gas concentrations, for example, argon at 0–13% of the total process gas flow. At these reduced levels, the etch or sputter rate decreases and the facet moves away from the element corners, as expected. However, cusps do not form on the element sidewalls because much less material is etched and thus available for redeposition. Consequently, with a greatly reduced sputter component, gaps remain open longer so that higher aspect ratio gaps can be filled without the formation of voids. In addition, because other system parameters can remain unchanged from conventional HDP deposition processes, the pressure for the process gas can be reduced because the inert gas concentration, and therefore the total gas concentration, decreases as the etch/dep ratio decreases.

DETAILED DESCRIPTION

Figure 1A:
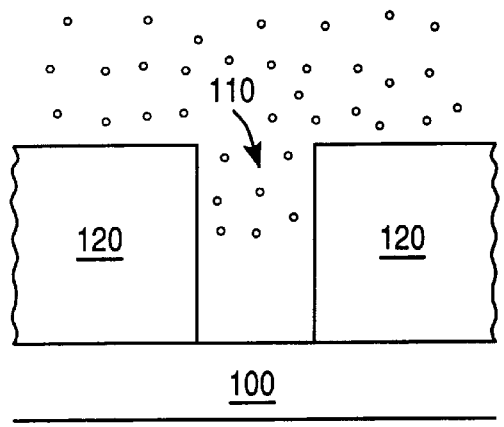
FIGS. 1A–1D are sequential views of a conventional HDP deposition process with optimized etch/dep ratios.
Figure 1B:
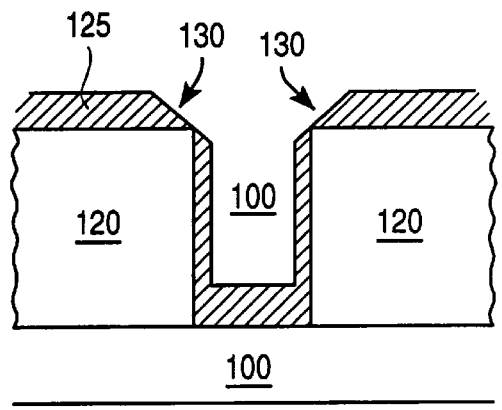
Figure 1C:
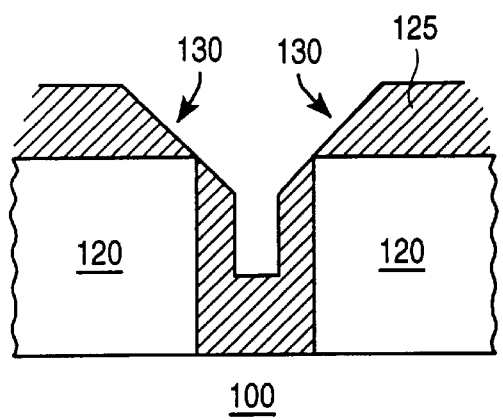
Figure 1D:
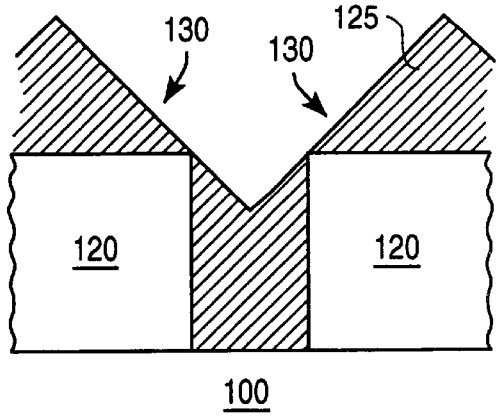
Figure 2A:
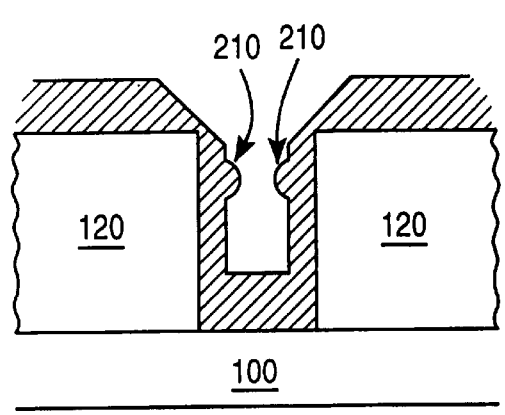
FIGS. 2A–2B are sequential views illustrating void formation when the etch/dep ratio decreases using a conventional HDP process.
Figure 2B:
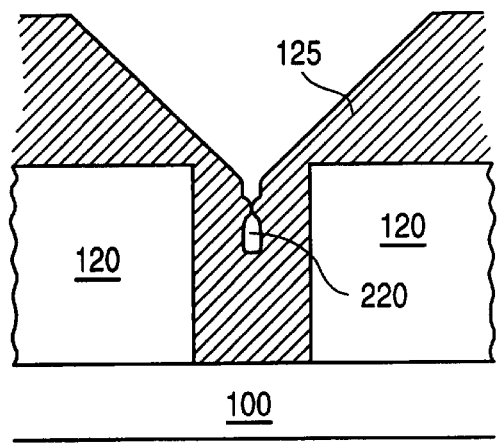
Figure 3:
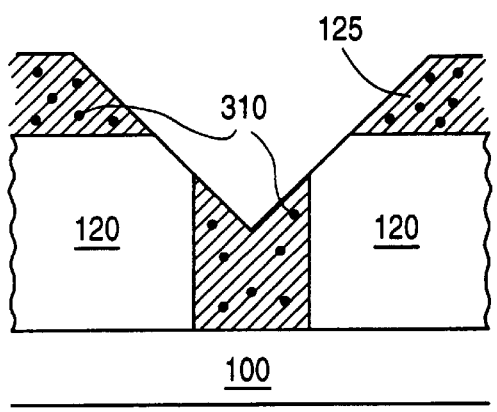
FIG. 3 is a picture of "clipped" corners when the etch/dep ratio increases using conventional HDP processes.
Figure 4:
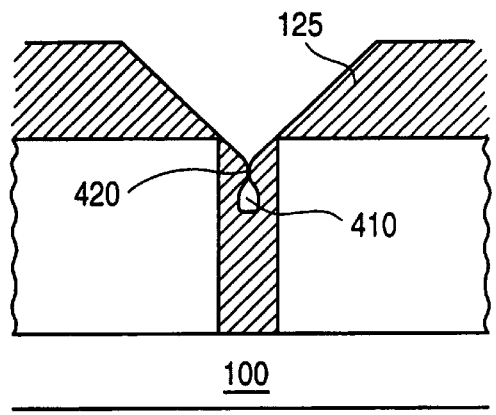
FIG. 4 is a picture of void formation when filling a high aspect ratio gap using a conventional HDP process.

In accordance with an embodiment of the present invention, a process using high density plasma (HDP) deposition with reduced inert gas flows is provided, which allows high aspect ratio gaps to be filled without voids or clipped corners associated with conventional methods.

In one embodiment, the process of the present invention is used in a shallow trench isolation (STI) step, in which large numbers of small, closely spaced transistors are isolated from each other by filling gaps with a dielectric layer. The highest aspect ratios (>3.0:1) are associated with the STI step. The method of the present invention can also be used in other steps in the production of integrated circuits where films are deposited, such as the pre-metal dielectric (PMD), inter-metal dielectric (IMD), passivation, and anti-reflective layer (ARL) steps. PMD steps typically provide insulator layers, e.g., P, B, or BP-doped oxide, between polysilicon structures and the first metal interconnect layer. On the other hand, IMD steps provide insulator layers, e.g., undoped $SiO_2$ or F-doped oxide, between subsequent metal interconnect layers. Passivation steps provide protection layers, such as SiN or SION, for the wafer, while ARL steps deposit layers for photolithography improvements.

Similar to conventional HDP deposition processes, a gas mixture containing silane ($SiH_4$), oxygen ($O_2$), and argon (Ar) is used to simultaneously deposit and etch dielectric material, where $SiH_4$ and $O_2$ are used to form $SiO_2$ for the deposition component, and $O_2$ and Ar are used for the sputter component. These gases are not limiting, and other suitable gases include any gases normally used for a particular film deposition process. For instance, other inert or etchant gases, such as He or $H_2$, may be substituted for Ar. However, contrary to conventional HDP processes, the concentration of Ar in the present invention is no more than 13% of the total process gas flow. For example, Table 1 below lists the three gases and their respective gas flow ranges, with the actual gas flow amount dependent upon the wafer size.

TABLE 1

| Gas | Flow Rate (sccm) |
|---|---|
| $SiH_4$ | 80–250 |
| $O_2$ | 120–500 |
| Ar | 0–50 |

For example, typical gas flow rates for 200 mm wafer processing are $SiH_4$ at 90 sccm, $O_2$ at 160 sccm, and Ar at 15 sccm, which puts the Ar concentration at 5.66% of the total process gas flow.

In addition to reduced Ar concentrations, the method of the present invention allows lower pressures than prior HDP processes. Acceptable pressure ranges from 1–3 mTorr, with a preferred pressure of 2 mTorr, compared to prior methods of typically 5 mTorr or higher. The other process parameters remain the same as with prior HDP processes. For example, temperatures can range from 350°–700° C. and are determined by the type of film deposition. For instance, in STI and PMD steps, temperatures can reach up to 700°, while in IMD and passivation steps, temperatures typically cannot exceed 400°–450° C. Low frequency (LF) and high frequency (HF) power requirements are similarly unchanged, with the LF power ranging from 1.5–7.5 kW and the HF power ranging from 1.5–5.0 kW, again dependent upon the wafer size. A radio frequency (RF) power supply at 13.56 MHz is preferred for the present process.

A further parameter for the process of this invention is the amount of bias voltage applied to the wafer substrate in order to maintain and control the directionality of the deposition. A bias voltage in the range of −150 V to −40 V, along with the lower sputter etch rate resulting from reduced etchant gas amounts, allows higher aspect ratio gaps to be filled without the formation of voids, as illustrated in FIGS. 5A–5D.

Figure 5A:
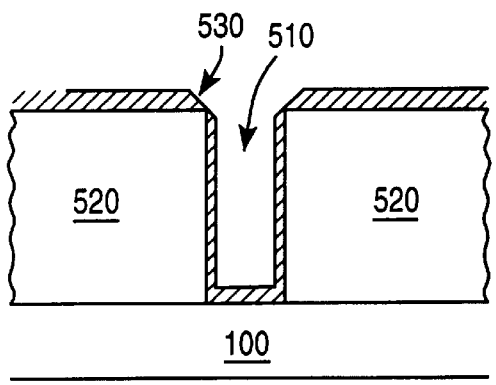
FIGS. 5A–5D are sequential views of high aspect ratio gaps filled with the method of the present invention.
Figure 5B:
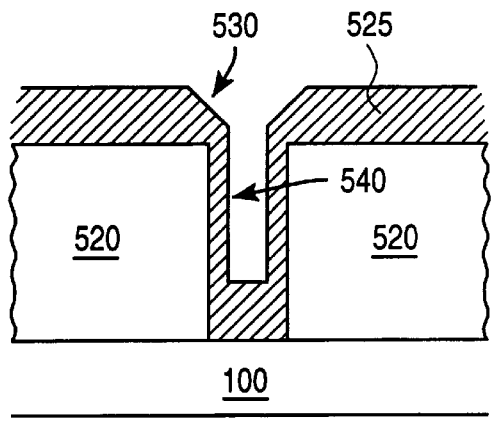
Figure 5C:
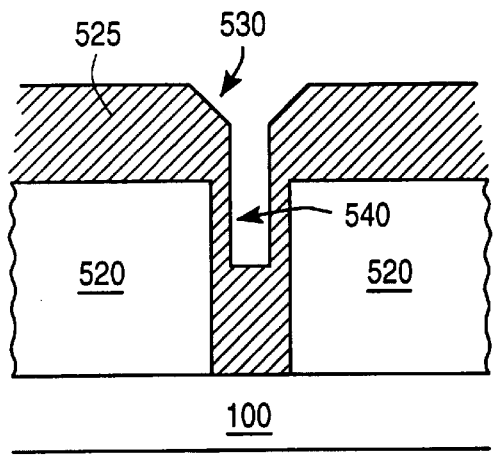

In FIG. 5A, circuit elements 520 are formed on a substrate or wafer 100, creating gaps 510 therebetween. Circuit elements 520 can be, for example, transistors, conductors, or interconnects. A gap 510 with a high aspect ratio, typically greater than 2.5:1, is filled using HDP deposition with reduced Ar flow. During the initial stages of the process, 45° facets 530 form at the corners of circuit elements 520, as shown in FIG. 5A. Even though Ar or another inert gas, which is the primary etchant, is reduced or even eliminated, other ionized gases, such as $O_2$, also contribute to the etching component. Therefore, even though drastically reduced, an etching component still exists which forms the facets 530 in FIG. 5A. However, because the etching component is reduced, facets 530 begin to move away from the corners of circuit elements 520 as more material deposits on the surfaces to form the $SiO_2$ or dielectric layer 525, as shown in FIGS. 5B and 5C.

Figure 5D:
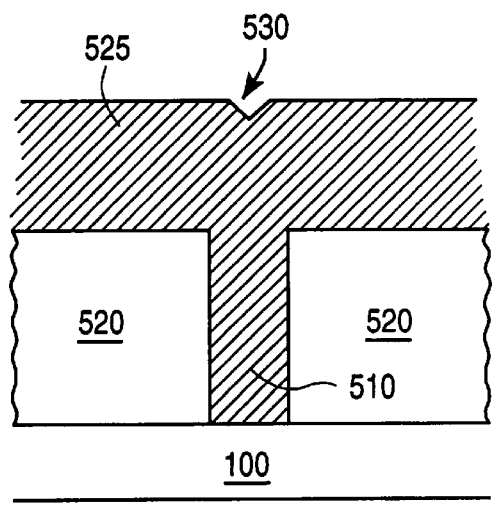
Figure 6:
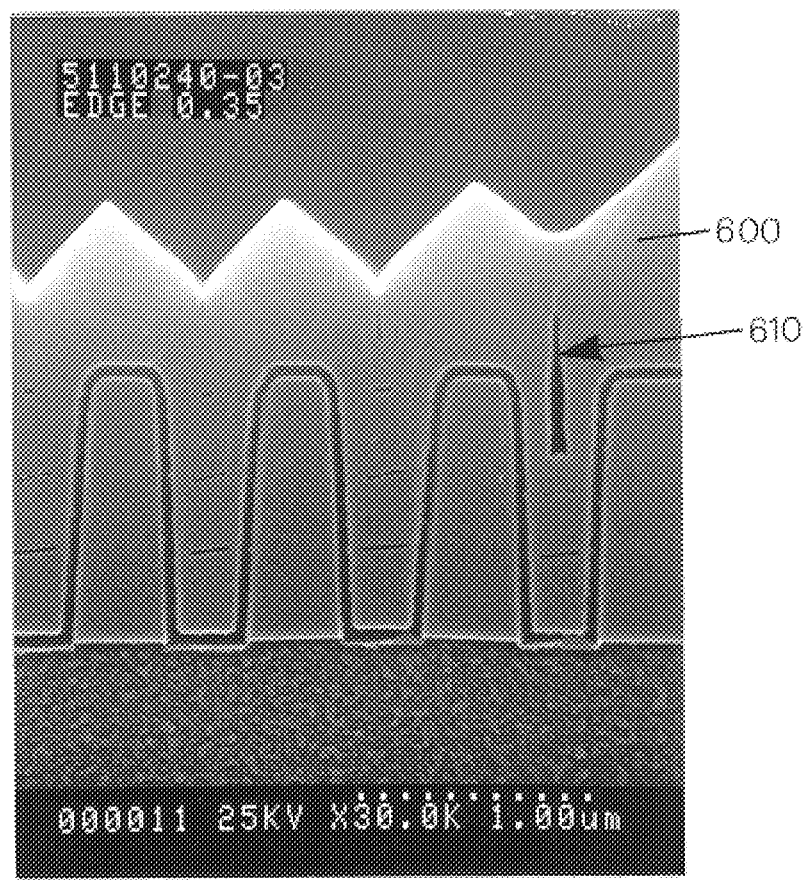
FIG. 6 is a scanning electron microscope (SEM) picture of a 4.0:1 aspect ratio gap filled using conventional HDP processes.
Figure 7:
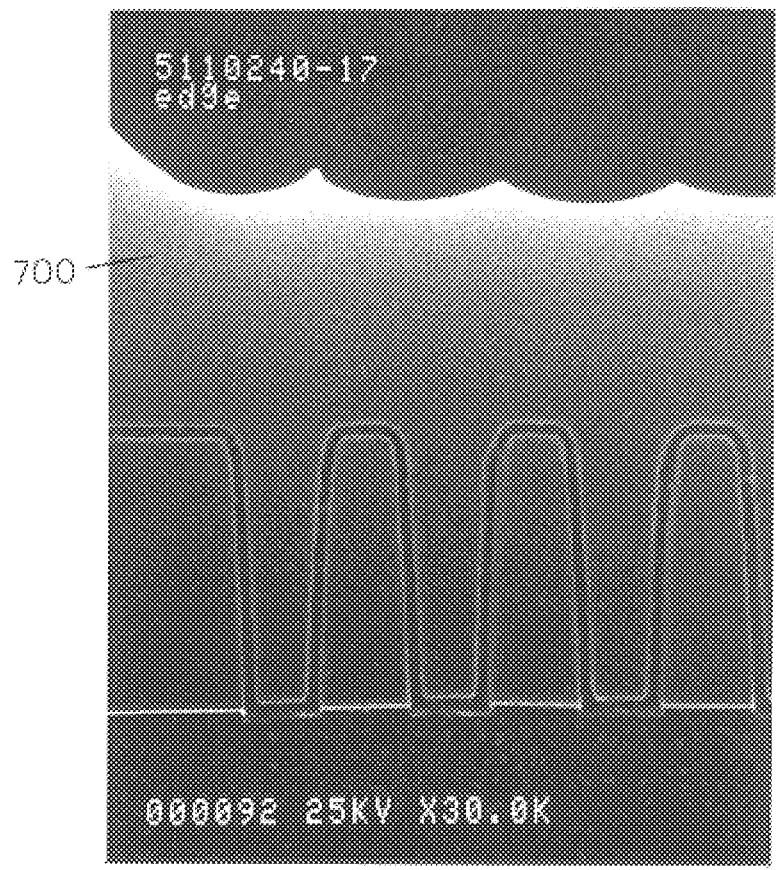
FIG. 7 is a SEM picture of a 4.0:1 aspect ratio gap filled using the method of the present invention.

Another consequence of reducing the amount of inert gases is that sidewall redeposition is reduced. Because the sputtering component is greatly reduced, much less material is available to redeposit on sidewalls 540 and facets 530, as shown in FIGS. 5B and 5C. As a result, cusp formation is drastically reduced, and facets move away more slowly from the corners of the circuit elements. Because there is very little sidewall deposition, which is mainly driven by redeposition, high aspect ratio gaps do not close prematurely even though the facets are moving away from the corners. FIG. 5D then shows high aspect ratio gap 510 filled without void formation or clipping. FIGS. 6 and 7 are scanning electron microscope (SEM) pictures of a 4.0:1 aspect ratio gap filled using a conventional HDP process and using the method of the present invention, respectively. FIG. 6 shows a void 610 formed in dielectric layer 600, while FIG. 7 shows a void-free dielectric layer 700.

Figure 8:
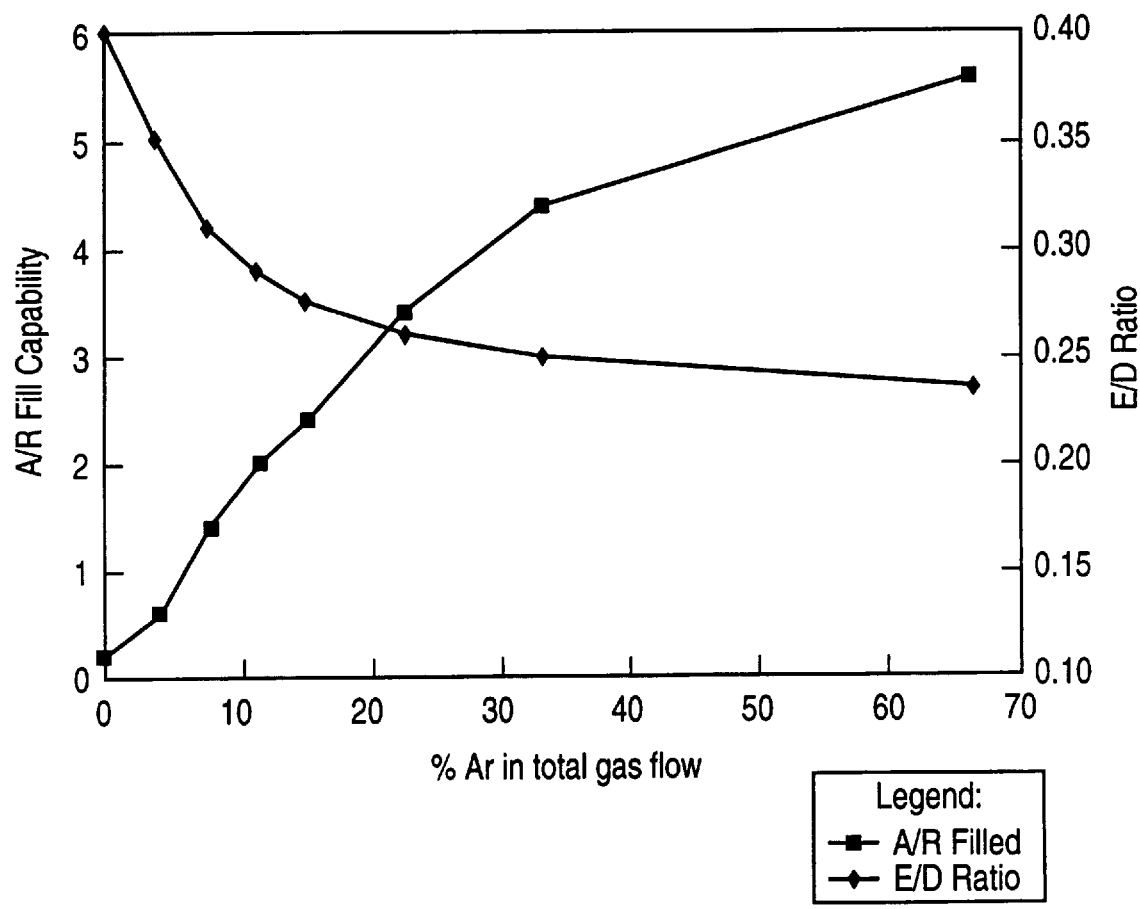
FIG. 8 is a graph of the relationship between the aspect ratio gapfill capability and the etch/dep ratio as a function of argon percentage for the present invention.

In accordance with the present invention, gaps with aspect ratios up to 6.0:1 and with widths of 0.1 micron have been filled without the formation of voids, as shown in FIG. 8. In addition, FIG. 8 shows that as the concentration of Ar decreases, the etch/dep ratio decreases, which corresponds to the overall deposition rate increasing, and the aspect ratio gapfill capability increases.

Therefore, by reducing the inert gas concentration, a void-free gapfill is possible at higher aspect ratios than are possible with conventional HDP deposition processes.

While particular embodiments of the present invention have been shown and described, it will be obvious to those skilled in the art that changes and modifications may be made without departing from this invention in its broader aspects. Therefore, the appended claims are to encompass within their scope all such changes and modifications as fall within the true spirit and scope of this invention.

We claim:

1. A process for filling gaps during integrated circuit production, comprising the steps of:

providing a gas mixture comprised of silicon-containing, oxygen-containing, and inert components, wherein said inert components comprise no more than 13% total concentration of said gas mixture; and depositing a film over said gaps by using said gas mixture for simultaneous CVD and sputter etching.

2. The process of claim 1, wherein said silicon-containing component is silane.

3. The process of claim 1, wherein said oxygen-containing component is $O_2$.

4. The process of claim 1, wherein said inert component is selected from the group consisting of argon, helium and hydrogen.

5. The process of claim 1, wherein said gas mixture is at a pressure between 1 and 3 mTorr.

6. The process of claim 5, wherein said gas mixture is at a pressure of 2 mTorr.

7. The process of claim 2, wherein said silane is at a flow rate of 80 to 250 sccm.

8. The process of claim 3, wherein said $O_2$ is at a flow rate of 120 to 250 sccm.

9. The process of claim 4, wherein said inert component is argon at a flow rate of 0 to 50 sccm.

10. A process for filling gaps during integrated circuit production, comprising the step of:

depositing a film over said gaps by HDP deposition using a gas mixture comprised of silicon-containing, oxygen-containing, and inert components, wherein said inert components comprise no more than 13% total concentration of said gas mixture.

* * * * *